(12) United States Patent  (10) Patent No.: US 8,064,860 B2
Abraham  (45) Date of Patent: *Nov. 22, 2011

(54) METHOD AND APPARATUS FOR ADJUSTING REFERENCE OSCILLATOR FREQUENCY IN A MOBILE WIRELESS DEVICE

(75) Inventor: Charles Abraham, Los Gatos, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/942,502

(22) Filed: Nov. 9, 2010

(65) Prior Publication Data

US 2011/0053645 A1  Mar. 3, 2011

Related U.S. Application Data

(63) Continuation of application No. 11/504,853, filed on Aug. 16, 2006, now Pat. No. 7,848,778, which is a continuation of application No. 10/345,604, filed on Jan. 16, 2003, now Pat. No. 7,155,183.

(51) Int. Cl.
*H04B 1/06* (2006.01)
*G01C 21/00* (2006.01)

(52) U.S. Cl. .......... 455/255; 455/258; 701/213
(58) Field of Classification Search .............. 455/556.1, 455/196.1, 255, 258, 259, 264, 85, 86, 141, 455/147, 148; 342/357.1, 357.62, 357.64; 701/213, 214, 200, 225, 226, 207
See application file for complete search history.

(56) References Cited

U.S. PATENT DOCUMENTS

| | | | |
|---|---|---|---|
| 6,496,533 B2 * | 12/2002 | Lennen | 375/147 |
| 2003/0068977 A1 * | 4/2003 | King | 455/12.1 |
| 2003/0154025 A1 * | 8/2003 | Fuchs et al. | 701/213 |

* cited by examiner

*Primary Examiner* — Kiet Doan

(74) *Attorney, Agent, or Firm* — McAndrews, Held & Malloy, Ltd.

(57) ABSTRACT

A method and apparatus for using a conventional oscillator in a cellular telephone transceiver as a source of a reference signal for a GPS receiver. In one embodiment, the method comprises using a voltage-controlled oscillator ("VCXO") within a cellular telephone transceiver to generate a reference frequency signal for the GPS receiver. Circuitry within the telephone transceiver generates a frequency error signal. Both of these signals are coupled to GPS circuitry and used to control a carrier numerically controlled oscillator ("NCO") and a code NCO. The NCOs produce a tuning signal and a timing signal, respectively. The GPS circuitry uses the NCO generated signals to process GPS signals.

20 Claims, 5 Drawing Sheets

US 8,064,860 B2

METHOD AND APPARATUS FOR ADJUSTING REFERENCE OSCILLATOR FREQUENCY IN A MOBILE WIRELESS DEVICE

CROSS-REFERENCE TO RELATED APPLICATIONS/INCORPORATION BY REFERENCE

This application is a continuation of U.S. patent application Ser. No. 11/504,853, Method and Apparatus for Adjusting Reference Oscillator Frequency in a Mobile Wireless Device, filed Aug. 16, 2006, by Charles Abraham, that is a continuation of U.S. patent application Ser. No. 10/345,604, filed Jan. 13, 2003. The foregoing applications are herein incorporated by reference.

BACKGROUND OF THE INVENTION

The present invention relates to mobile devices as used in object location systems. In particular, the present invention relates to a method and apparatus for controlling an oscillator frequency in a mobile wireless device.

BACKGROUND OF THE INVENTION

The Federal Communications Commission of the United States promulgated FCC Commercial Mobile Radio Services, 47 C.F.R. §20.18(e) (2001) that requires cellular telephones to be geographically identifiable. As such, cell phone carriers have been developing solutions for identifying the location of cellular telephones.

One solution combines a Global Positioning System (GPS) receiver into a cellular telephone transceiver into an integrated mobile wireless device. The GPS receiver may be a standard receiver such as disclosed in U.S. Pat. No. 4,968,891 (issued Nov. 6, 1990) or an assisted GPS (A-GPS) receiver such as disclosed in U.S. Pat. No. 6,453,237 (issued Sep. 17, 2002).

To simplify the mobile wireless device and reduce manufacturing costs, such an integrated device should use a single component for redundant components in the GPS receiver and the cellular telephone transceiver. One such redundant component is the reference oscillator that is generally located in both the transceiver and the GPS receiver. For example, U.S. Pat. No. 6,122,506 (issued Sep. 19, 2000) discloses such an integrated mobile device comprising a cellular telephone transceiver and a GPS receiver.

In many cellular systems, the oscillator must be adjusted to maintain the RF transmitter frequency within an allowed band. Therefore, there is a need in the art for an integrated mobile device that comprises a single oscillator for use by both the cellular telephone receiver and the GPS receiver and has compensation circuitry that allows the GPS receiver to continue to process signals when the oscillator is adjusted to maintain the cellular transmission frequency.

BRIEF SUMMARY OF THE INVENTION

The invention comprises a method and apparatus for using a conventional oscillator in a cellular telephone transceiver as a source of a reference signal for a GPS receiver. In one embodiment, the method comprises using a voltage-controlled oscillator ("VCXO") within a cellular telephone transceiver to generate a reference frequency signal for the GPS receiver. Circuitry within the telephone transceiver generates a frequency error signal. Both of these signals are coupled to GPS circuitry and used to control a carrier numerically controlled oscillator ("NCO") and a code NCO. The NCOs produce a tuning signal and a timing signal, respectively. The GPS circuitry uses the NCO generated signals to process GPS signals. These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

The teachings of the present invention may be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Figure 1:
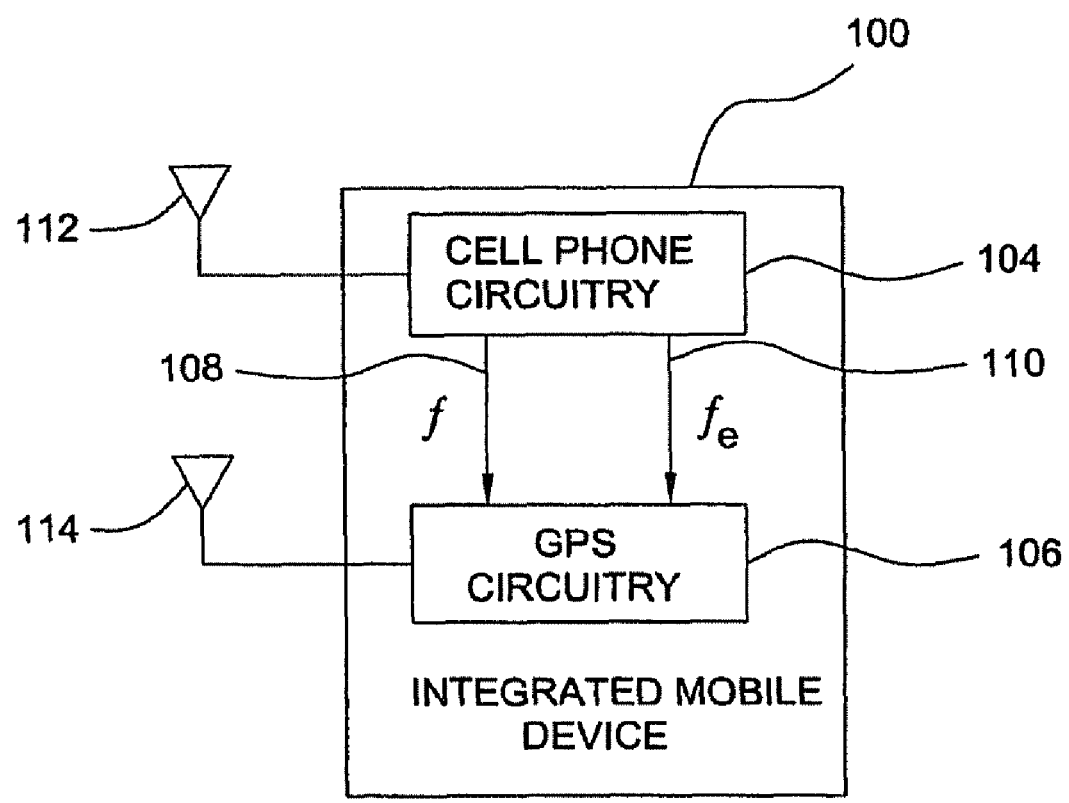
FIG. 1 depicts a block diagram of an integrated mobile device.

FIG. 1 depicts a block diagram of an integrated mobile device 100 comprising Global Positioning System (GPS) circuitry 106 coupled to cellular telephone (cell phone) circuitry 104. The GPS circuitry 106 has an antenna 114 for receiving GPS signals from GPS satellites. The cell phone circuitry 104 has an antenna 112 for transceiving cellular telephone signals that is coupled to both receiver and transmitter circuits. In addition, cell phone circuitry 104 provides a reference frequency signal ("f") on path 108 and frequency error signal ("$f_e$") on path 110 to the GPS circuitry 106. As the temperature of the cell phone circuitry 104 changes, the frequency of the VCXO will vary. As described below, the variations in frequency are not continuously corrected by the cell phone circuitry 104. As such, the frequency varies substantially. This frequency error is not severe enough to impact cellular telephone signal reception; however, the error is too great to be used by the A-GPS circuitry that incorporates long averaging intervals such as described in U.S. Pat. No. 6,453,237 (issued Sep. 17, 2002). As a result, the VCXO output cannot be directly used by the GPS circuitry 106.

In operation, the cell phone circuitry 104 operates in a conventional manner to receive and transmit signals that facilitate cellular telecommunications. The GPS circuitry 106 receives and processes GPS satellite signals in a conventional manner to identify the location of the integrated mobile device 100. The GPS circuitry 106, in accordance with the present invention, does not have a voltage controlled reference oscillator. Instead, the GPS circuitry 106 uses signals f and $f_e$ from the cell phone circuitry 104 to facilitate GPS signal processing. In this manner, the manufacturing costs of the mobile device are reduced.

The foregoing discussion describes the GPS circuits as being conventional, i.e., the circuits receive and process GPS signals that are transmitted from GPS satellites to derive the location information directly from the GPS signals. In some instances, conventional GPS signal processing is not sufficient to rapidly decode the GPS signals in a low signal level environment. Consequently, assisted GPS ("A-GPS") circuitry may be used as described in U.S. Pat. Nos. 6,453,237 (issued Sep. 17, 2002) and 6,411,892 (issued Jun. 25, 2002), which are both herein incorporated by reference. In such A-GPS circuitry, certain "aiding information" such as satellite ephemeris and estimated mobile device position is provided to the A-GPS circuitry via a cellular telephone network and the cell phone circuitry 104. Furthermore, in such A-GPS circuitry coherent signal averaging over many C/A code epochs is used to enhance weak signal detection. Throughout this disclosure, the term GPS circuitry or GPS receiver is intended to include A-GPS circuitry or A-GPS receiver, i.e., A-GPS and GPS are herein used interchangeably unless otherwise noted.

Figure 2:
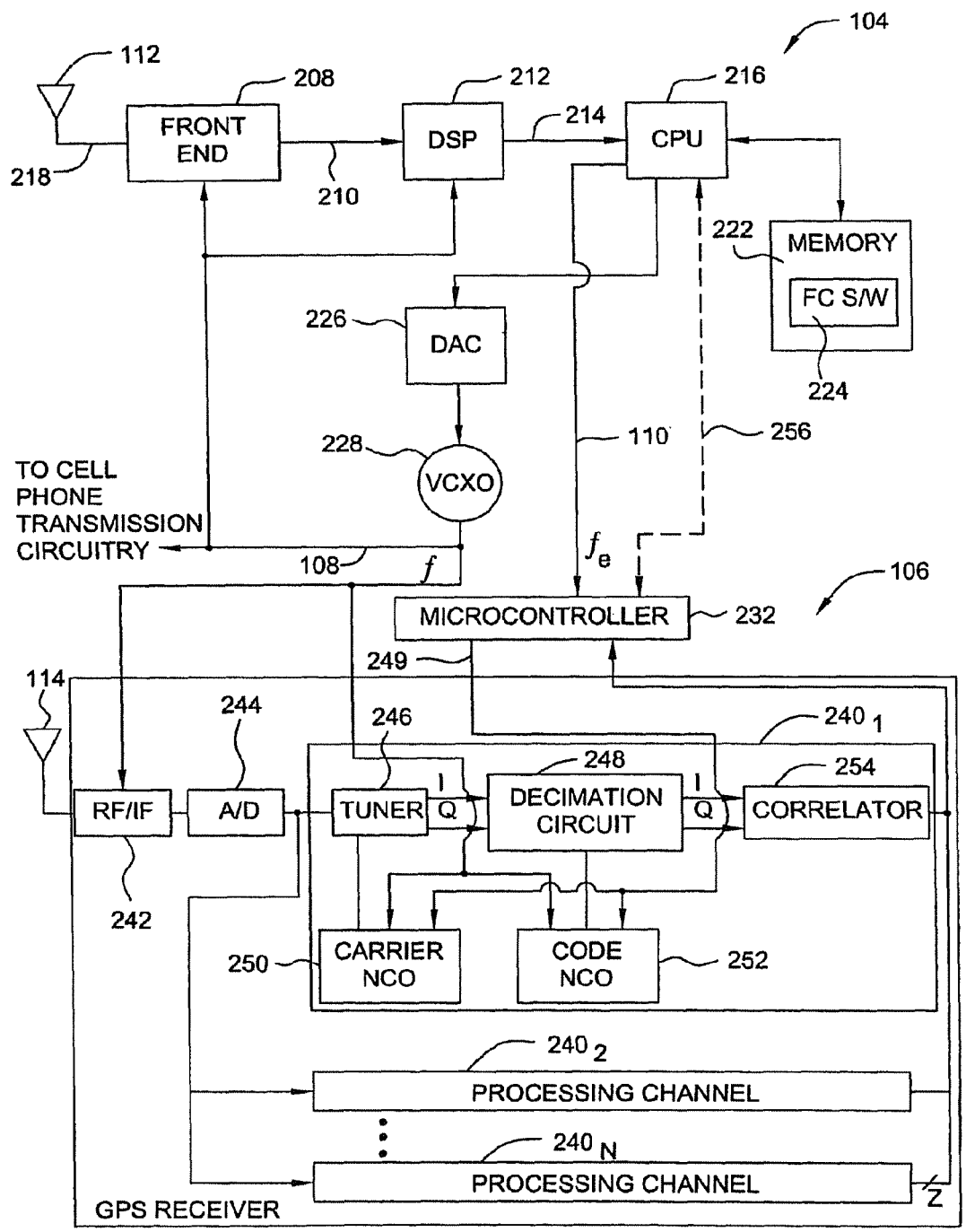
FIG. 2 depicts a block diagram of an embodiment of an apparatus for producing a reference oscillator signal for a GPS receiver in accordance with the invention and further includes an optional connection 256 between the CPO 216 and controller 232.

FIG. 2 depicts a block diagram of an embodiment of an apparatus for providing a reference oscillator signal to a GPS receiver in accordance with the invention. Specifically, the cell phone circuitry 104 is configured for operation as a wireless transceiver in essentially any of the various types of wireless communication networks that are available. For instance, the cell phone circuitry 104 can be broadly defined as a wireless communication subsystem that may be configured for operating in a terrestrial or celestial wireless network, including cellular (digital or analog), or personal communications systems (PCS). This includes digital systems configured for operation as local-area networks or wide-area networks. Therefore, the cell phone circuitry 104 is merely illustrative of the types of wireless devices that are suitable for operation in accordance with the present invention, as would be evident to one of ordinary skill in the art upon reading the present disclosure. Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The cell phone circuitry 104 comprises, in part, an RF front end 208, a digital signal processor 212 ("DSP"), a central processing unit 216 ("CPU"), a digital to analog converter 226 ("DAC"), and voltage-controlled crystal oscillator 228 ("VCXO"). The circuitry 104 is coupled to an antenna 112. In one embodiment, circuitry 104 includes a memory 222 for storing frequency-control software 224. In another embodiment the CPU 216 and its associated memory 222 are an application-specific integrated circuit ("ASIC") for controlling the VCXO 208. While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

Signals received by the antenna 112 are coupled to an RF front end 208 that provides the necessary amplification, filtering, and mixing operations. To perform these functions, the front end 208 contains components such as a phase lock loop ("PLL"). One skilled in the art appreciates the general purpose of a PLL circuit. In the present case, a PLL circuit may be used to increase the frequency of the VCXO signal to a frequency that is useful for down conversion of the received signal. The RF front end 208 generally shifts (down converts) the frequency spectrum to an intermediate frequency, and boosts the low-level RF signal to a level appropriate for processing by the DSP 212.

The DSP 212 typically includes various circuits for extracting data and voice signals from the received cellular telephone signal. In addition, the DSP 212 compares the output of the local VCXO 228 to a carrier or pilot tone of the received cellular telephone signal to produce a frequency error signal on path 214. The frequency error signal is processed by the CPU 216 to produce a value (digital word or message) that represents the magnitude of the frequency error signal. The value of the frequency error signal is sent by CPU 216 to a DAC 226 and a microcontroller 232. The frequency error signal is the difference in hertz between the received signal and signal derived from the VCXO signal that is used to perform the down conversion within the front end 208 (i.e., the error signal is the difference between the center frequency of the actual IF signal and the center frequency of the ideal IF signal).

The CPU 216, in one embodiment, executes the frequency-control software 224 stored within memory 218. As such, the CPU 216 produces a control voltage for the DAC 226 that is responsive to the frequency error signal $f_e$. The DAC 226, in turn, produces an analog signal for controlling the frequency of the VCXO signal on path 108. The signal f on path 108 is coupled to the GPS circuitry 106, the front end 208, the DSP 212, and to the cell phone transmission circuitry. The front end 208 uses the reference frequency signal 230 to process the received signal from the antenna 112 as discussed above.

Figure 5:
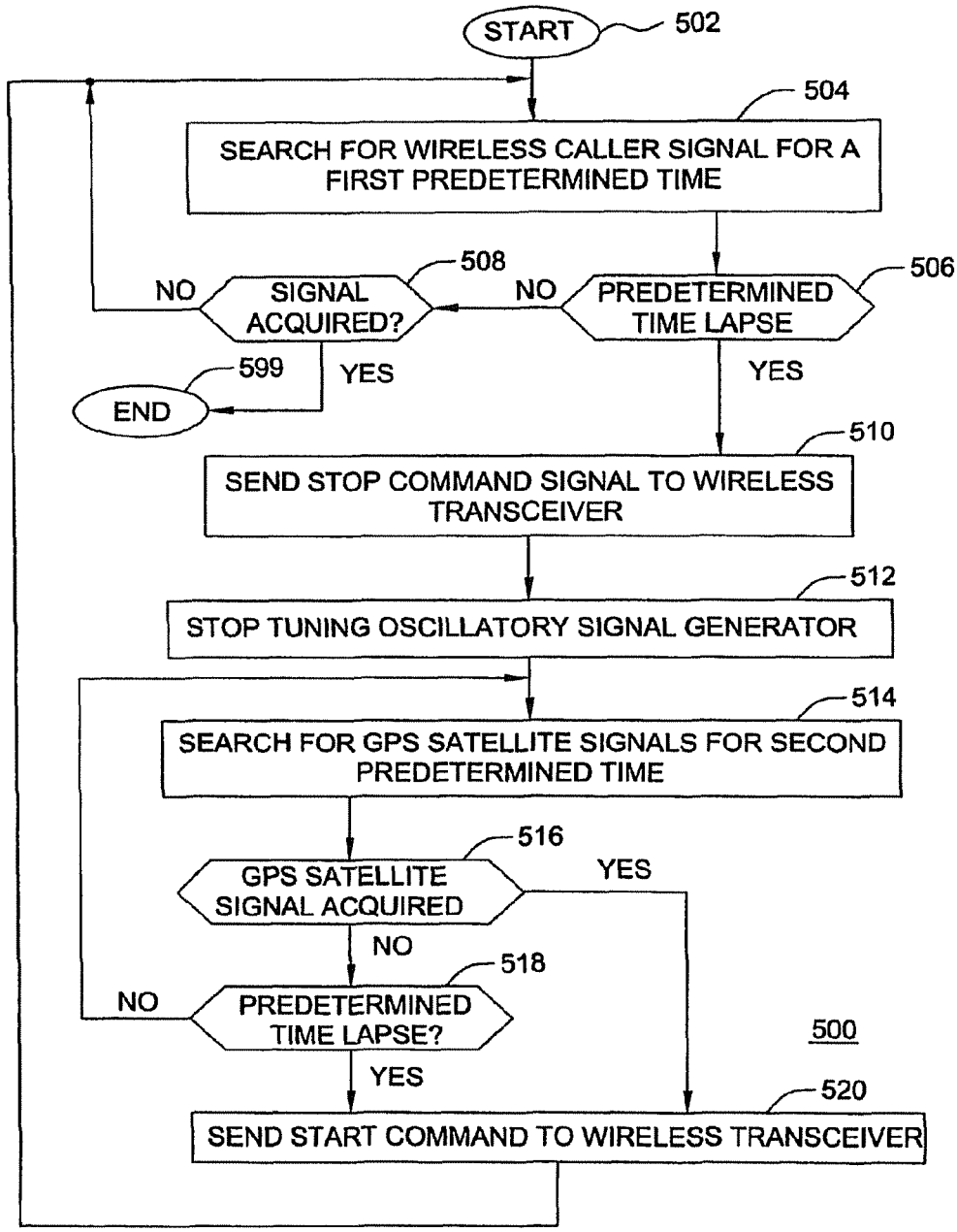
FIG. 5 depicts an embodiment of the method of operation of the optional connection as depicted in FIG. 2.

In yet another embodiment, the apparatus 100, as explained below with reference to FIG. 5, includes an optional connection 256 between the CPU 216 and the microcontroller 232.

Figure 4:
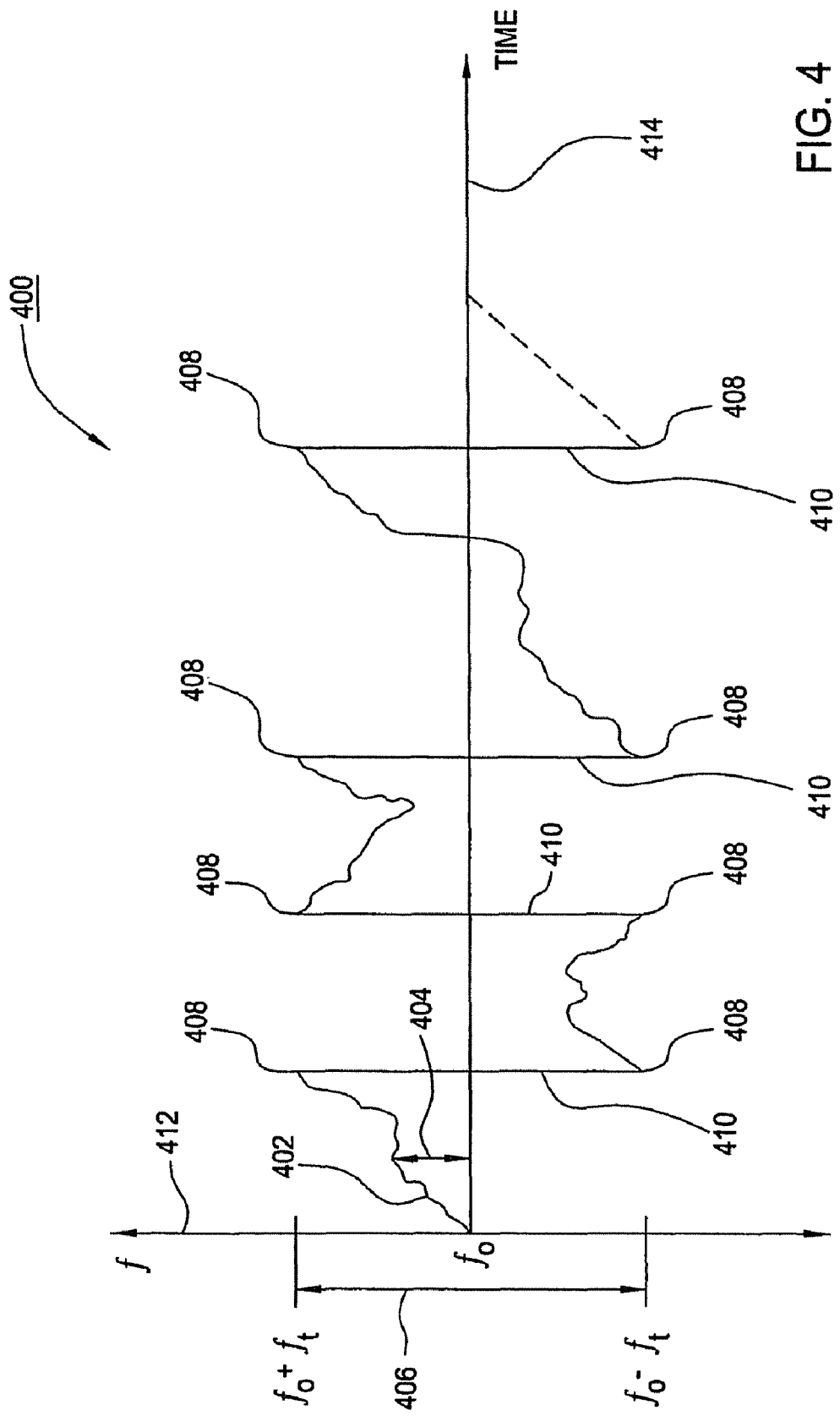
FIG. 4 depicts an example of an error signal produced by the oscillator control circuits of a cellular telephone receiver.

FIG. 4 depicts a graph 400 of an example of the frequency error signal $f_e$ (axis 412) on path 110 versus time (axis 414). The nominal frequency of the signal produced by the VCXO 228 is at a frequency $f_o$. The frequency control software 224 establishes threshold at .+−. $F_t$ about the frequency $f_o$. The IF signal on path 210 is typically a changing frequency due to Doppler shift caused by movement of the mobile device relative to the cellular antenna tower, due to the asynchronous operation of the cellular telephone system base station oscillator and the VCXO 228, due to VCXO instability (e.g., variations in temperature) as well as other causes. These inaccuracies cause the frequency error signal $f_e$ to change from frequency $f_o$. To produce frequency error signal $f_e$, the DSP 212 processes the IF signal to determine the difference between the actual IF signal center frequency and the ideal center frequency of the IF signal. As the center frequency of the IF signal drifts from the ideal center frequency, the frequency error increases (magnitude 404). At the threshold frequency $f_t$, the control software causes the CPU to adjust the output frequency f of the VCXO 228 toward the opposite threshold frequency $f_o-f_t$ or $f_o+f_t$. As such, the frequency f of the VCXO 228 remains within the bounds of the cell phone threshold frequencies. Since the VCXO output is also used by the transmitter within the cell phone circuitry, if the VCXO signal were to drift outside the bounds of the threshold frequency, the transmitted signal may interfere with other cellular telephone signals and transceivers. As such, the VCXO signal must stay within the bounds. However, cell phone operation bounds are larger than desired for GPS signal processing of very weak signals.

In one embodiment, the CPU 216 does not constantly control the VCXO output. The control only occurs on an intermittent basis when the VCXO signal is greater than the threshold frequency, e.g., at times 410 when the error curve 402 reaches point 408. At that time, the CPU 216 and DAC 226 "kick" the VCXO signal frequency to a value near the opposite frequency threshold.

In another embodiment, the frequency-control software 224 instructs the CPU 216 to constantly adjust the VCXO 228 output to more accurately track the carrier or pilot tone, i.e., to minimize the amount of correction required due to frequency error.

Returning to FIG. 2, signals (such as GPS signals) are received by an antenna 114. A radio-frequency-to-intermediate-frequency converter (RF/IF converter) 242 filters, amplifies, and frequency shifts the signal for digitization by an analog-to-digital converter (A/D) 244. The elements 114, 242 and 244 are substantially similar to those elements used in a conventional GPS receiver.

The output of the A/D 244 is coupled to a set of processing channels $240_1$, $240_2$, ... $240_n$ (where n is an integer) implemented in digital logic. Each processing channel $240_n$ may be used to process the signal from a particular GPS satellite. The signal in a particular channel is tuned digitally by a tuner 246, driven by a carrier numerically controlled oscillator (NCO) 250 that generates a carrier tuning signal. The tuner 246 serves two purposes. First, the IF frequency remaining after RF/IF conversion is removed to produce a baseband or near baseband signal. Second, the frequency variations that occur due to satellite Doppler frequency shift resulting from satellite motion, and user motion, as well as reference frequency errors $f_e$ is removed. The output from the tuner is a baseband or near-baseband signal consisting of an in-phase component (I) and a quadrature component (Q). The tuner 246 and decimation circuit 248 are substantially similar to those used in a conventional GPS receiver. The carrier NCO 250 provides a reference signal for the tuner 246. The reference signal is produced by clocking the NCO 250 using the VCXO frequency on line 108 and controlling the NCO with a control word provided by the microcontroller 232 that incorporates the frequency error signal $f_e$.

A decimation circuit 248 processes the output of the tuner 246. The output of the decimation circuit 248 is a series of complex signal samples with I and Q components, output at a rate precisely timed to match the timing of the input signal. In one embodiment of the invention, the decimation operation is a simple pre-summer that sums all the incoming signal samples over the period of an output sample. A code numerically controlled oscillator (NCO) 252 is used to time the sampling process. For example, the code NCO 252 is set to generate a frequency of (2.times. $f_s$), where $f_s$ is $f_o$ (the GPS signal's C/A code chipping rate), adjusted for Doppler shift. The NCO 252 adjusts for Doppler shift as well as the frequency error $f_e$ based on external input from firmware commands on path 249. Because the Doppler shift is different for each satellite, a separate code NCO 252 and decimation circuit 248 is required for each channel $240_n$. It should be noted that there is no requirement that the incoming sample rate be an integer multiple of the frequency $f_s$, as the code NCO 252 is capable of generating an arbitrary frequency. If the decimation circuit 248 is a pre-summer, the number of samples summed will typically toggle between two values, so that over the long term, the correct sample timing is maintained. For example, if the incoming sample rate is 10 MHz, and the desired sample rate is 2.046 MHz, the pre-summer will add either 4 or 5 samples, so that the desired sample rate is maintained on average.

The decimation circuit 248 may also include a quantizer (not shown) at its output to reduce the number of bits in the signal components before further processing. In one embodiment of the invention, 2-bit quantization is used.

The signal samples from decimation circuit 248 are coupled to a correlator 254. In one embodiment of the invention, the correlator 254 operates substantially as described in commonly assigned U.S. application Ser. No. 09/963,345, filed Sep. 26, 2001. In other embodiments, the correlator 254 may be a more conventional digital signal correlator.

Figure 3:
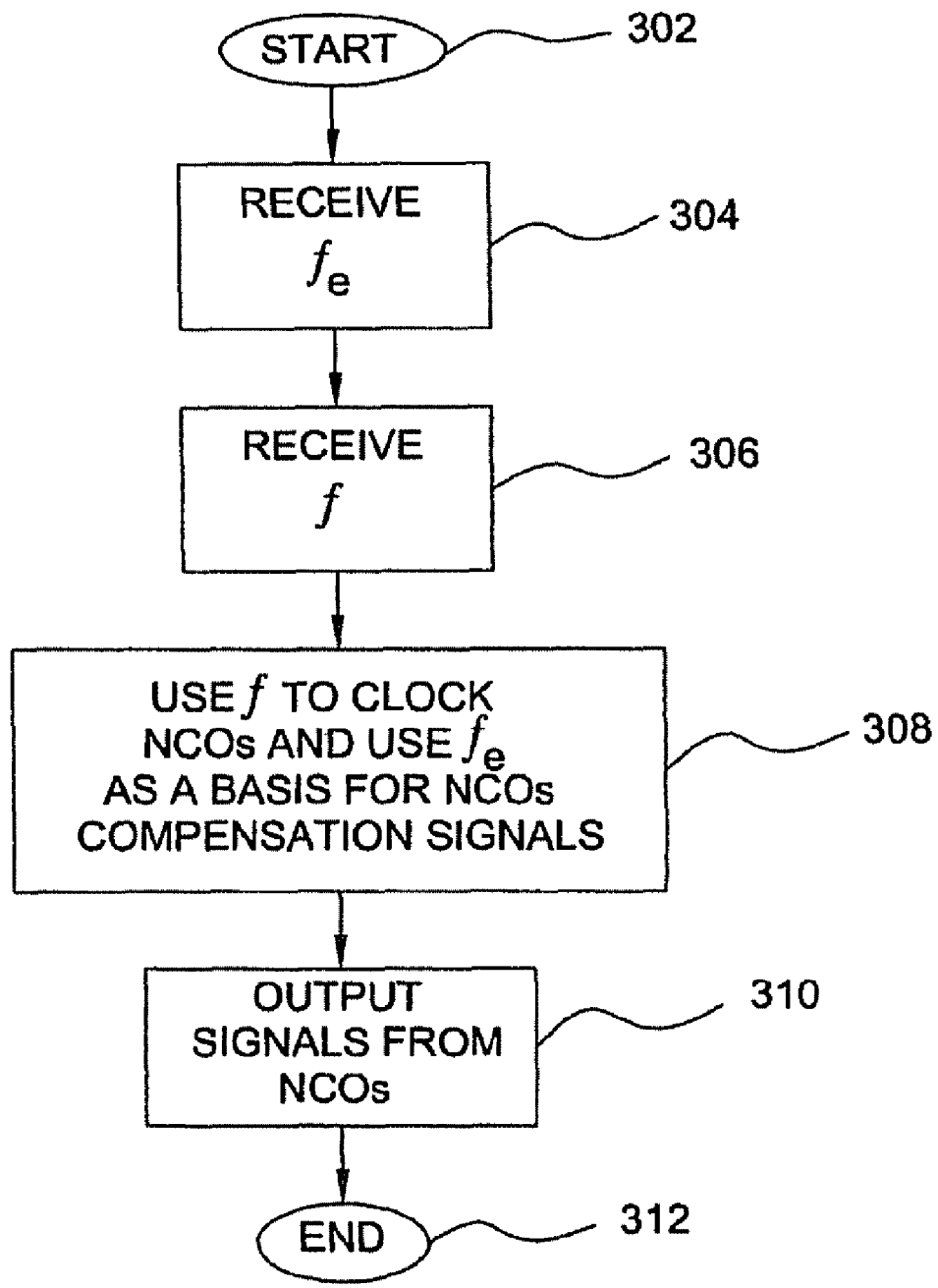
FIG. 3 depicts a data flow diagram of an embodiment of a method used in accordance with the invention.

FIG. 3 depicts a flow diagram of an embodiment of the method used in accordance with the invention. Further, the method 300 is taken from the perspective of signals processed by the GPS circuitry 106. The method 300 starts at step 302 and proceeds to step 304. At step 304, a control word that contains frequency error signal $f_e$ is produced by the microcontroller and is coupled to both the carrier and code numerically controlled oscillators 250 and 252 within GPS circuitry 106. The GPS circuitry 106 also receives the VCXO signal f, at step 306. The signal f is used by the RF/IF circuit 242 and both NCOs 250 and 252. At step 308, the numerically controlled oscillators are clocked using the frequency f and their output signals are adjusted by the control word (frequency control value) on path 249 that contains information regarding the frequency error signal $f_e$. The numerically controlled oscillators 250 and 252, at step 310, generate signals and the method 300 ends at step 312. The operation performed by the numerically controlled oscillators 250 and 252 is similar to a subtraction of $f_e$ from f, i.e., the frequency of the reference oscillator signals is equal to $f-f_e$ multiplied by a scaling factor.

The NCO generated signals have a substantially stable frequency that can be used by the GPS receiver to process GPS signals. For example, the cell phone specification for transmission is +/−0.3 parts-per-million ("ppm") in Japan's Personal Digital Cellular ("PDC") system. Although 0.3 ppm frequency error is acceptable for the PDC system, it is unacceptable for GPS signal processing with coherent averaging over many code epochs. A more acceptable ppm level that is accurate enough for a GPS receiver is on the order of about 0.02 ppm (about 31.5 Hz), sufficient for coherent averaging over 10-20 code epochs. The parts-per-million refers to the deviation at the cell phone reference clock frequency of 19.2 MHz. This leads to the same fractional deviation at the GPS carrier frequency of 1575 MHz.

There may be instances when the mobile device 100 travels outside of the wireless network coverage area such that the cellular telephone circuitry 104 with not receive a signal to use to control the VCXO 228. Although the mobile device 100 may be outside of the network coverage area, the location of the device 100 may still be obtained as described below. FIG. 5 depicts a flow diagram of a method 500 of acquiring a GPS signals in a mobile device 100 during out-of network coverage. FIG. 5 should be viewed in conjunction with FIG. 2. FIG. 2 contains an optional connection 256 that connects the CPU 216 to microcontroller 232. The method 500 starts at step 502, where the mobile device 100 is out-of-network coverage area, and no longer receives a carrier signal (or pilot tone) from a base station. At step 504, the mobile device 100 searches for a wireless carrier signal from a cell. In one embodiment, the mobile device 100 performs these searches for a first predetermined time. Such first predetermined time may be in a range of about 10-60 seconds, and in one specific embodiment, is about 30 seconds.

At step 506, the wireless signal processing circuitry 106 determines if the predetermined time for searching the wireless carrier has elapsed. If at step 506, the first predetermined time has not lapsed, and at step 508 the wireless carrier signal has been acquired, then the method 500 proceeds to step 599, where the mobile device 100 is operational and the method 500 ends, and method 300 of FIG. 3 may be implemented. Further, if at step 506, the first predetermined time has not lapsed, and at step 508 the wireless carrier signal has not been acquired, then the method 500 proceeds to step 504 to search for the wireless carrier signal. The method 500 continues in this manner until, at step 506, the predetermined time has lapsed, or at step 508, the signals are acquired.

If, at step 506, the first predetermined time has lapsed, then the method 500 proceeds to step 510, where the frequency-controlling software 224 in the wireless signal processing circuitry initiates a signal that drives the first oscillatory signal generator (e.g., VCO) 228 of the wireless transceiver 104 to a nominal frequency by setting the DAC 226 voltage to a predetermined voltage. The VCO frequency nominalizing signal is sent along path 256 of FIG. 2. In this mode, the frequency reference won't be as accurate as when in the mobile device is within network coverage area. However, the $f_e$ signal won't be factor because the reference frequency is not dependent upon a pilot tone or a carrier signal. In particular, for a typical oscillator, the uncertainty in the VCXO 228 output will be on the order of 2 ppm when the DAC voltage is set to the predetermined voltage. The GPS algorithm for this embodiment includes frequency searching over this broader range of frequency uncertainty.

At step 512, the VCO 228 is no longer tuned over the wide range of frequencies for a second predetermined time. Accordingly, the mobile device 100 no longer is able to simultaneously search for GPS satellite signals and the wireless carrier signal from a wireless carrier. The method 500 then proceeds to step 514.

At step 514, the GPS receiver 106 continues to search for the satellite signals. Specifically, the GPS receiver 106 performs the search for the duration that the VCO 228 is inactive. At step 516, the GPS signal processor 232 determines whether the GPS satellite signals have been acquired. If at step 516, the GPS satellite signals have been acquired, then the GPS signal processor 232 informs the wireless signal processing circuitry 104 as such, and the method 500 proceeds to step 520 as discussed below. If at step 516, the GPS satellite signals have been acquired, then the method 500 proceeds to step 518, where the GPS signal processor 232 determines whether the second predetermined time has lapsed. In one embodiment, the second predetermined time is in a range of about 20 seconds to 30 seconds, however, shorter or longer durations are also possible. If, at step 518, the second predetermined time to acquire the GPS satellite signals has lapsed, then the method 500 proceeds to step 520. If at step 518, the second predetermined time to acquire the GPS satellite signals has not lapsed, then the method 500 proceeds to step 514, and repeats steps 514 through 518 as discussed above.

At step 520, the GPS signal processor 232 sends a VCO tuning initialization signal via path 256 to the wireless signal processing circuitry 104. The VCO tuning initialization signal instructs the wireless processing circuitry to send a tuning command to the wireless transceiver 104 to initiate a search for a wireless carrier, and the method 500 proceeds to step 504 as discussed above, until either the GPS satellite signals or wireless carrier signal is acquired.

Accordingly, when the mobile device 100 is in areas without network coverage, the method 500 alternates between searching for the GPS satellite signals and the wireless carrier signal. Further, the method 500 allows GPS reception without the VCXO 228 of the cellular telephone circuitry being adjusted by a received cell signal.

Although the above embodiment describes the mobile device's search for a wireless carrier signal for a predetermined time. This description is for exemplary purposes only. One skilled in the art will appreciate that the mobile device 100 may search for a wireless carrier until a first desired event occurs. In addition, one skilled in the art will also appreciate that the search for GPS satellite signals is not limited to the passage of a predetermined time and that the search for GPS satellite signals may also occur until the occurrence of a second desired event.

Although various embodiments, which incorporate the teachings of the present invention have been shown and described in detail herein, those skilled in the art can readily devise many other varied embodiments that still incorporate these teachings.

What is claimed is:

1. Apparatus within an integrated mobile device comprising:
   cell phone circuitry for generating of an oscillator signal and a frequency error signal;
   a controller, coupled to the cell phone circuitry, for processing the frequency error signal to produce a frequency control value;
   a carrier numerically controlled oscillator, within GPS circuitry, for generating a carrier tuning oscillator signal in response to the oscillator signal and the frequency control value signal; and
   a code numerically controlled oscillator, within GPS circuitry, for generating a code timing oscillator signal in response to the oscillator signal and the frequency control value.

2. The apparatus of claim 1, wherein the cell phone circuitry comprises a voltage controlled crystal oscillator for generating the oscillator signal.

3. The apparatus of claim 1, wherein the GPS circuitry comprises assisted GPS circuitry.

4. The apparatus of claim 1, wherein the frequency control value is a digital word.

5. The apparatus of claim 1, wherein the cell phone circuitry further comprises a digital signal processor for generating the frequency error signal and supplying the frequency error signal to the controller.

6. The apparatus of claim 1, wherein the cell phone circuitry further comprises a memory for storing frequency control software for adjusting the frequency of the voltage controlled oscillator under the control of the controller.

7. The apparatus of claim 1, further comprising within the GPS circuitry at least one processing channel coupled to an analog-to-digital converter, wherein the at least one processing channel is adjusted by a tuner under a control of the carrier numerically controlled oscillator.

8. The apparatus of claim 7, wherein the carrier numerically controlled oscillator provides a reference signal to the tuner.

9. The apparatus of claim 7, further comprising a decimation circuit for processing an output of the tuner.

10. The apparatus of claim 9, wherein the code numerically controlled oscillator controls a sampling rate of the decimation circuit.

11. An integrated mobile device comprising:
    an oscillator operable to produce a cellular oscillator signal;

at least one numerically controlled oscillator, wherein the at least one numerically controlled oscillator is operable to generate, in response to the cellular oscillator signal and the frequency control value, a signal that is used for processing GPS satellite signals; and a processor operable to:

produce a frequency error signal to control the oscillator so as to cause the integrated mobile device to operate within cell phone network specifications;

produce a frequency control value;

search for a pilot tone or a carrier signal by tuning a frequency of the oscillator, fix the frequency of the oscillator when the pilot tone or the carrier signal are not found;

search for the GPS satellite signals; and return to searching for the pilot tone or the carrier signal when the GPS satellite signals are not found.

12. The integrated mobile device of claim 11, wherein the oscillator is a voltage controlled oscillator.

13. The integrated mobile device of claim 11, further comprising assisted GPS circuitry.

14. The integrated mobile device of claim 11, wherein the frequency control value is a digital word.

15. The integrated mobile device of claim 11, further comprising a memory for storing frequency control software for adjusting the frequency of the voltage controlled oscillator.

16. The integrated mobile device of claim 11, further comprising, at least one processing channel coupled to an analog-to-digital converter, wherein the at least one processing channel is adjusted by a tuner under a control of the at least one numerically controlled oscillator.

17. The integrated mobile device of claim 16, wherein the at least one numerically controlled oscillator comprises a carrier numerically controlled oscillator that provides a reference signal to the tuner.

18. The integrated mobile device of claim 17, further comprising a decimation circuit for processing an output of the tuner.

19. The integrated mobile device of claim 18, wherein the at least one numerically controlled oscillator comprises a code numerically controlled oscillator that controls a sampling rate of the decimation circuit.

20. A mobile device comprising:

means for producing-a cellular oscillator signal;

means for producing a frequency error signal for controlling the oscillator to operate the mobile device within cell phone network specifications and producing a frequency control value;

means for generating, in response to the cellular oscillator signal and the frequency control value, a signal that is used for processing GPS satellite signals; and means for searching for a pilot tone or a carrier signal by tuning a frequency of the means for producing the cellular oscillator signal;

means for fixing the frequency of the means for producing the cellular oscillator signal when the pilot tone or the carrier signal are not found;

means for searching for the GPS satellite signals; and means for returning to searching for the pilot tone or the carrier signal when the GPS satellite signals are not found.

* * * * *